(12) United States Patent
Lu

(10) Patent No.: US 7,780,253 B1
(45) Date of Patent: Aug. 24, 2010

(54) SLIDING RAIL ASSEMBLY SUPPORT FRAME AND SERVER FRAME MOUNTING ARRANGEMENT

(75) Inventor: Chun-Min Lu, Taipei Hsien (TW)

(73) Assignee: GSlide Corporation, Taipei Hsien (TW)

( * ) Notice: Subject to any disclaimer, the term of this patent is extended or adjusted under 35 U.S.C. 154(b) by 474 days.

(21) Appl. No.: 11/657,123

(22) Filed: Jan. 24, 2007

(51) Int. Cl.
*A47B 88/04* (2006.01)

(52) U.S. Cl. ..................... 312/334.4; 211/26

(58) Field of Classification Search .............. 312/334.4, 312/333, 330.1, 334.7, 334.8, 265.1, 265.4, 312/257.1, 350, 351; 248/221.11; 211/26, 211/182; 361/725, 726, 727
See application file for complete search history.

(56) References Cited

U.S. PATENT DOCUMENTS

| | | | | |
|---|---|---|---|---|
| 2,698,762 A * | 1/1955 | Dall | ............................... | 292/6 |
| 2,946,546 A * | 7/1960 | Pokorny et al. | .............. | 248/534 |
| 3,401,968 A * | 9/1968 | Testa et al. | ................... | 292/127 |
| 3,696,774 A * | 10/1972 | Ostrem | ......................... | 114/203 |
| 3,888,528 A * | 6/1975 | Jericijo | ..................... | 292/256.5 |
| 3,986,318 A * | 10/1976 | McConnell | ................. | 403/384 |
| 4,474,492 A * | 10/1984 | Fleitas | ...................... | 403/322.4 |
| 4,919,557 A * | 4/1990 | Podosek | ....................... | 402/41 |
| 5,791,498 A * | 8/1998 | Mills | ............................. | 211/26 |
| 6,260,810 B1 * | 7/2001 | Choi | ............................. | 248/65 |
| 6,273,534 B1 * | 8/2001 | Bueley et al. | ............. | 312/334.8 |
| 6,315,336 B1 * | 11/2001 | Swartzell | ..................... | 292/201 |
| 6,523,918 B1 * | 2/2003 | Baiza | ......................... | 312/265.1 |
| 6,622,873 B2 * | 9/2003 | Hegrenes et al. | ............. | 211/26 |
| 6,736,277 B2 * | 5/2004 | Lauchner et al. | ............. | 211/26 |
| 6,830,300 B2 * | 12/2004 | Lauchner | ................. | 312/334.5 |
| 6,840,388 B2 * | 1/2005 | Mayer | ......................... | 211/26 |
| 6,854,611 B2 * | 2/2005 | Powell | ....................... | 211/192 |
| 6,926,378 B2 * | 8/2005 | Greenwald et al. | ....... | 312/334.4 |
| 6,929,336 B2 * | 8/2005 | Liu et al. | ................. | 312/223.1 |
| 7,012,808 B2 * | 3/2006 | Mayer | ......................... | 361/725 |
| 7,281,694 B2 * | 10/2007 | Allen et al. | ................. | 248/244 |
| 2003/0106864 A1 * | 6/2003 | Kaminski | ..................... | 211/26 |
| 2003/0107309 A1 * | 6/2003 | Lauchner | ................. | 312/334.5 |
| 2004/0219807 A1 * | 11/2004 | Weiss et al. | ................... | 439/91 |
| 2005/0156493 A1 * | 7/2005 | Yang et al. | ............... | 312/334.5 |
| 2005/0285492 A1 * | 12/2005 | Hu et al. | .................. | 312/334.4 |

* cited by examiner

*Primary Examiner*—James O Hansen
(74) *Attorney, Agent, or Firm*—Cook Alex Ltd.

(57) ABSTRACT

A sliding rail assembly support frame and server frame mounting arrangement includes two server frames provided at front and rear sides inside a server, two support frames each having a flat frame base respectively affixed to front and rear ends of the outer rail of a sliding rail assembly and a mounting flange perpendicularly extended from one end of the flat frame base and a plurality of cylindrical mounting members provided at the mounting flange and selectively inserted through mounting holes on the server frames, and two clamping plates respectively clamped on the mounting members to secure the support frames to the server frames.

8 Claims, 18 Drawing Sheets

SLIDING RAIL ASSEMBLY SUPPORT FRAME AND SERVER FRAME MOUNTING ARRANGEMENT

BACKGROUND AND SUMMARY OF THE INVENTION

The present invention relates to a sliding rail assembly support frame and server frame mounting arrangement and more particularly, to an improved design of sliding rail assembly support frame and server frame mounting arrangement, which allows quick installation of the sliding rail assembly support frames in the front and rear server frames with less labor and time.

According to a conventional sliding rail assembly support frame and server frame mounting arrangement, as shown in FIGS. 1~3, the outer rail 71 of the sliding rail assembly 7 has its front and rear ends respectively fastened to two support frames 81 and 82 with fastening members 70. The support frames 81 and 82 each have a mounting flange 811 or 821. The mounting flanges 811 and 821 of the support frames 81 and 82 each have three mounting holes 8111 or 8211 selectively fastened to the mounting holes 911 of the front and rear server frames 91 of a server frame unit 9.

This mounting arrangement has drawbacks as follows:
1. Because two sliding rail assemblies 7 must be installed in the server frame unit 9 at two sides, totally 12 screws are necessary to affix the mounting holes 8111 and 8211 of the two pairs of support frames 81 and 82 to the two sets of front and rear server frames 91 of the server frame unit 9. Therefore, the installation of the sliding rail assembly support frame and server frame mounting arrangement requires much labor and time.
2. Because sliding sleeves with balls are provided among the inner sliding rail 73, intermediate sliding rail 72 and outer rail 71 of each sliding rail assembly 7, the inner sliding rail 73 or intermediate sliding rail 72 may slide over the mounting flange 811 or 821 of the support frame 81 or 82 (see FIGS. 1 and 3) if the support frame 81 or 82 is tilted during its installation, resulting in an inconvenience of alignment of the mounting screws 83 or 84.

The present invention has been accomplished under the circumstances in view. According to one aspect of the present invention, the sliding rail assembly support frame and server frame mounting arrangement comprises two server frames provided at front and rear sides inside a server, each server frame having a plurality of mounting holes arranged at different elevations, two support frames respectively fastened to the server frames to support a sliding rail assembly, each support frames having a flat frame base respectively affixed to front and rear ends of the outer rail of the sliding rail assembly and a mounting flange perpendicularly extended from one end of the flat frame base and selectively fastened to the mounting holes of the server frames, a plurality of mounting members fixedly provided at each mounting flange and selectively inserted through the mounting holes of the front and rear server frames, and two clamping plates respectively attached to the mounting members at the support frames to secure the support frames to the server frames. Each clamping plate has a plurality of retaining notches for engagement with the mounting members at the associating support frame.

According to another aspect of the present invention, each clamping plate has an angled finger strip for positive gripping with the hand so that the clamping plates can easily be installed without tools.

DETAILED DESCRIPTION OF THE INVENTION

Figure 1:
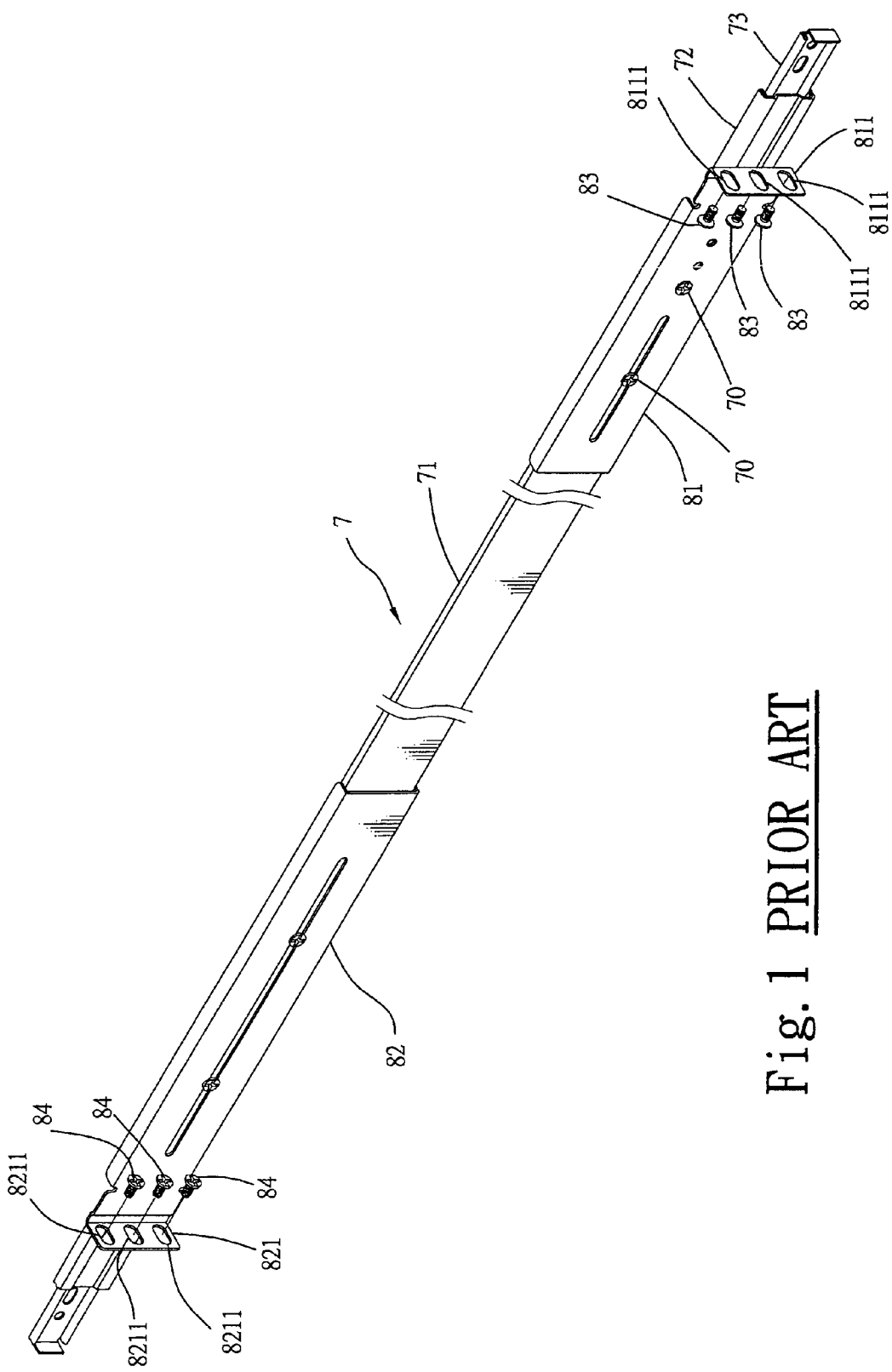
FIG. 1 is a schematic elevational view of a conventional sliding rail assembly for server.
Figure 2:
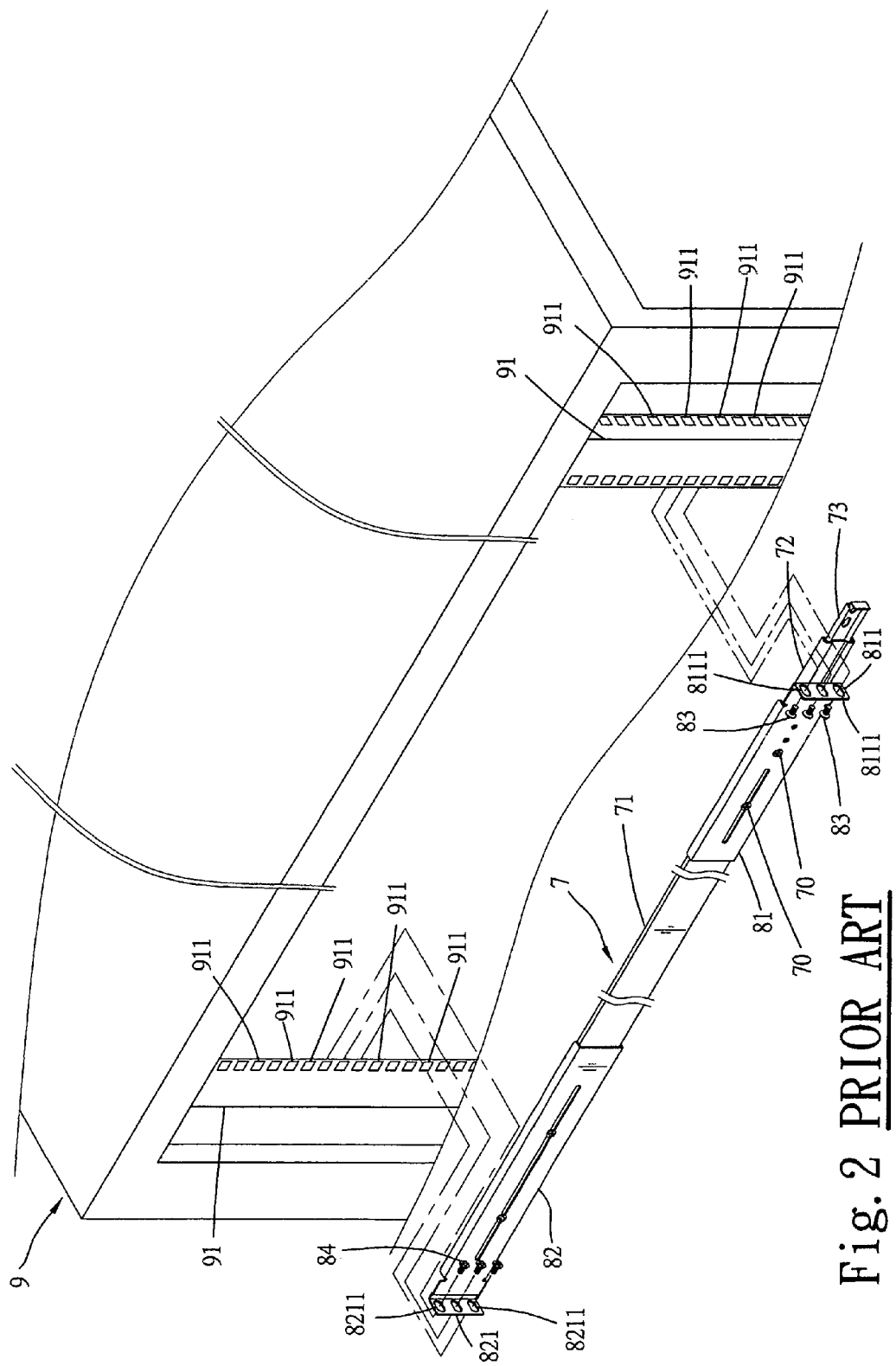
FIG. 2 is a schematic exploded view of a sliding rail assembly support frame and server frame mounting arrangement according to the prior art.
Figure 3:
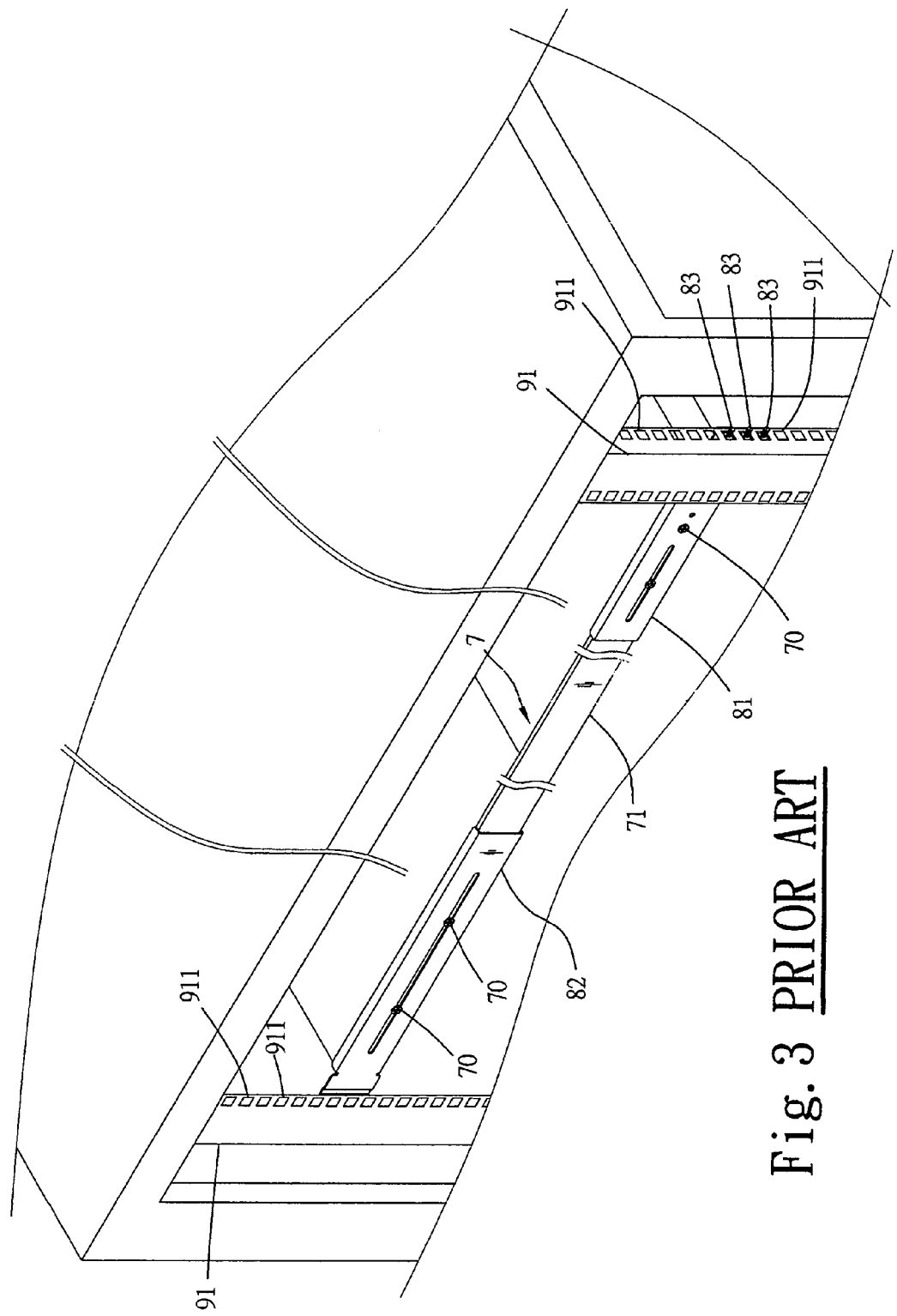
FIG. 3 is an assembly view of FIG. 2.
Figure 4:
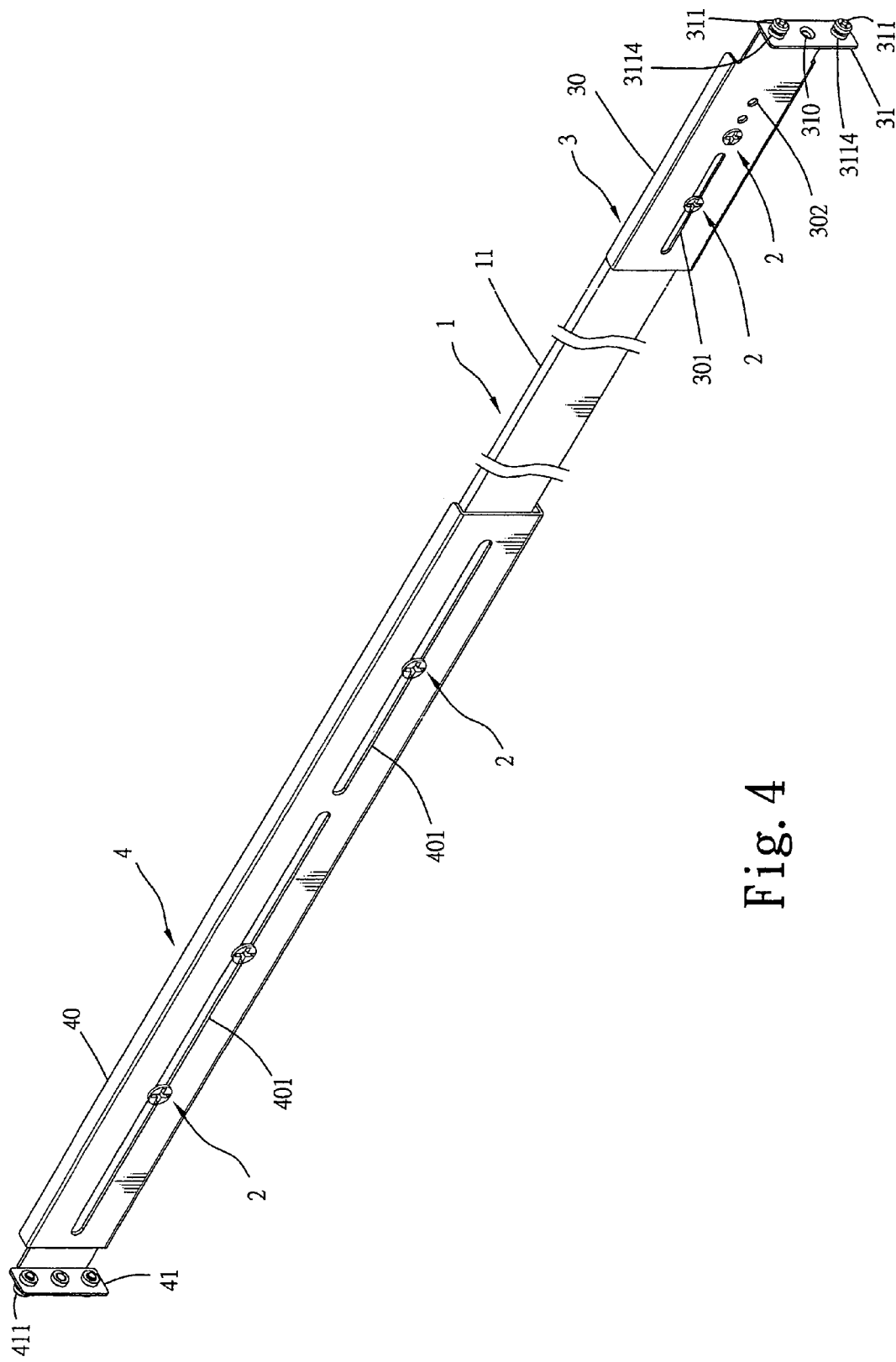
FIG. 4 is a schematic elevational view illustrating two support frames affixed to the outer rail of a sliding rail assembly according to the present invention.
Figure 5:
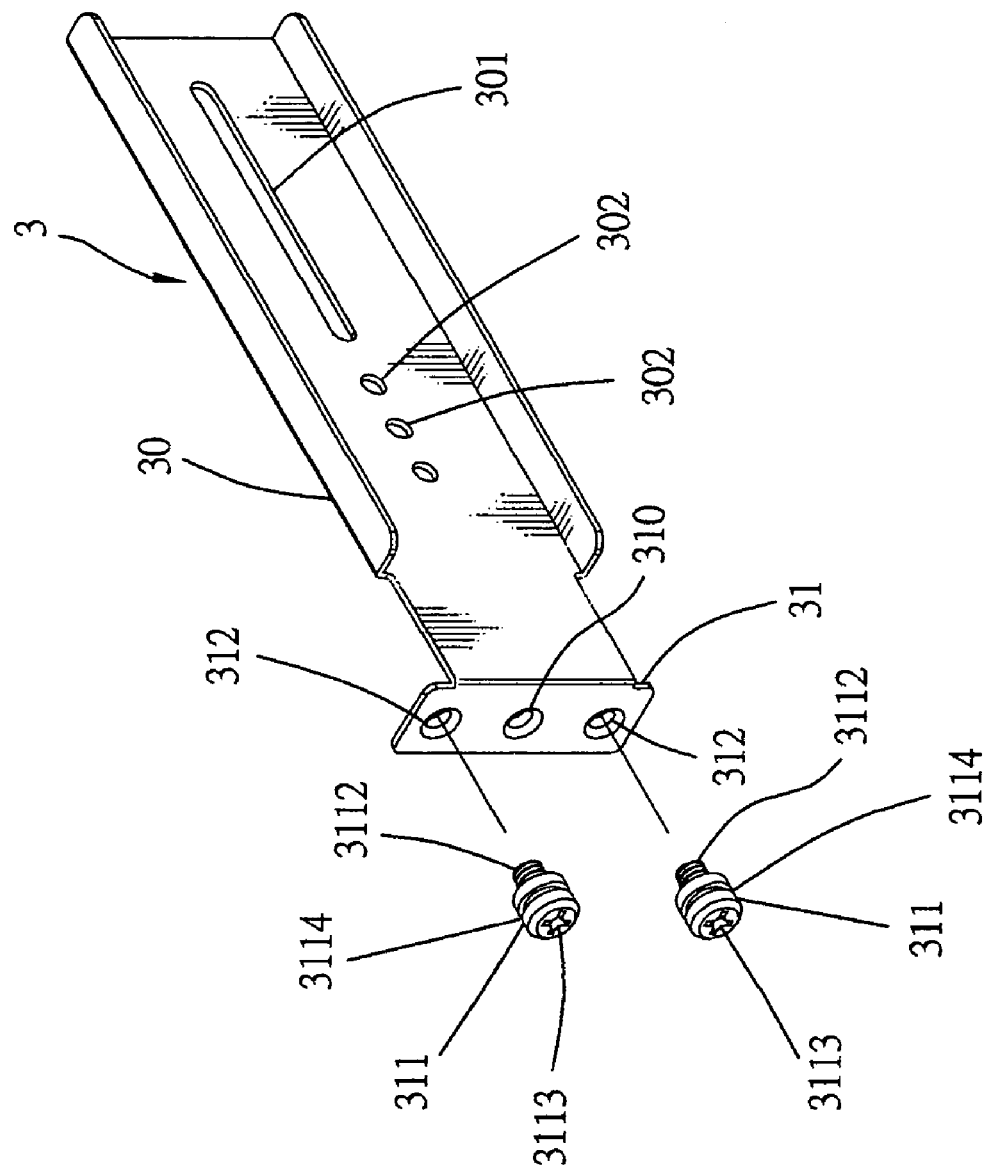
FIG. 5 is an exploded view of one support frame for sliding rail assembly support frame and server frame mounting arrangement according to the present invention.
Figure 6:
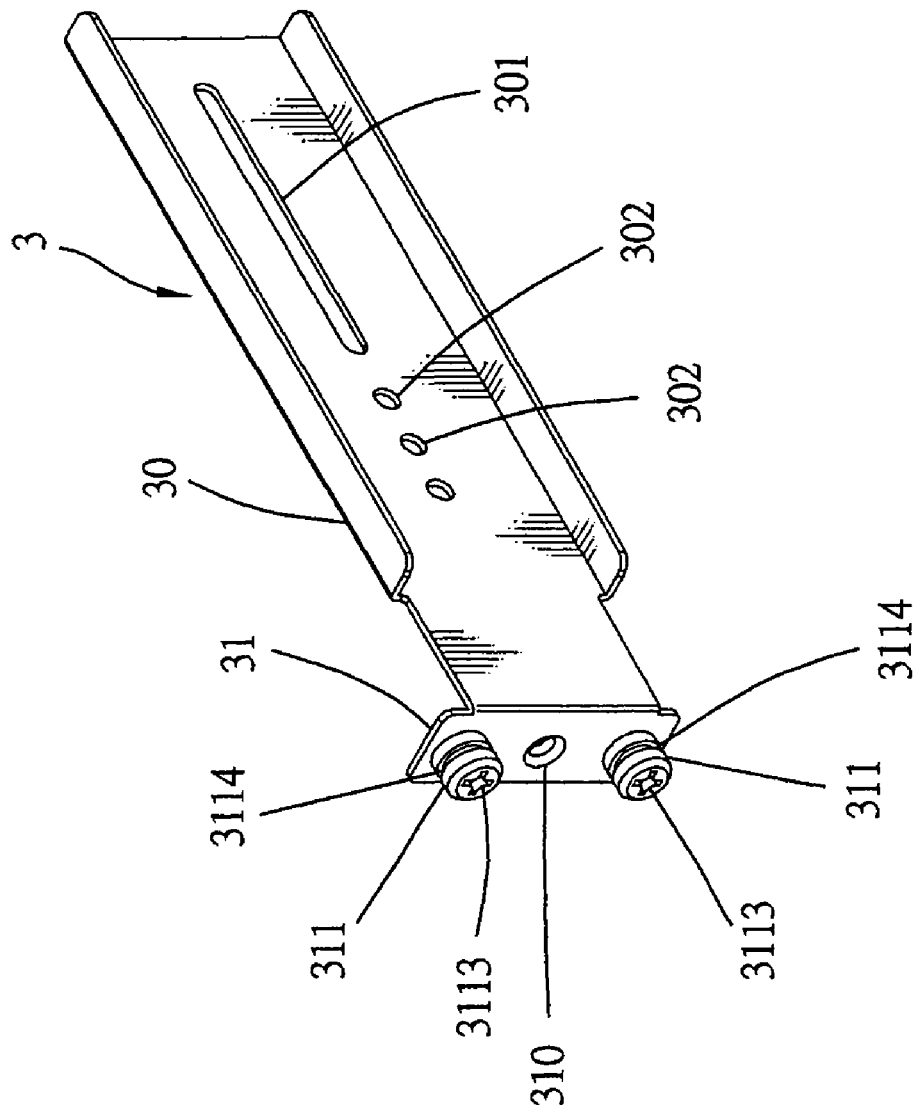
FIG. 6 is an assembly view of FIG. 5.
Figure 7:
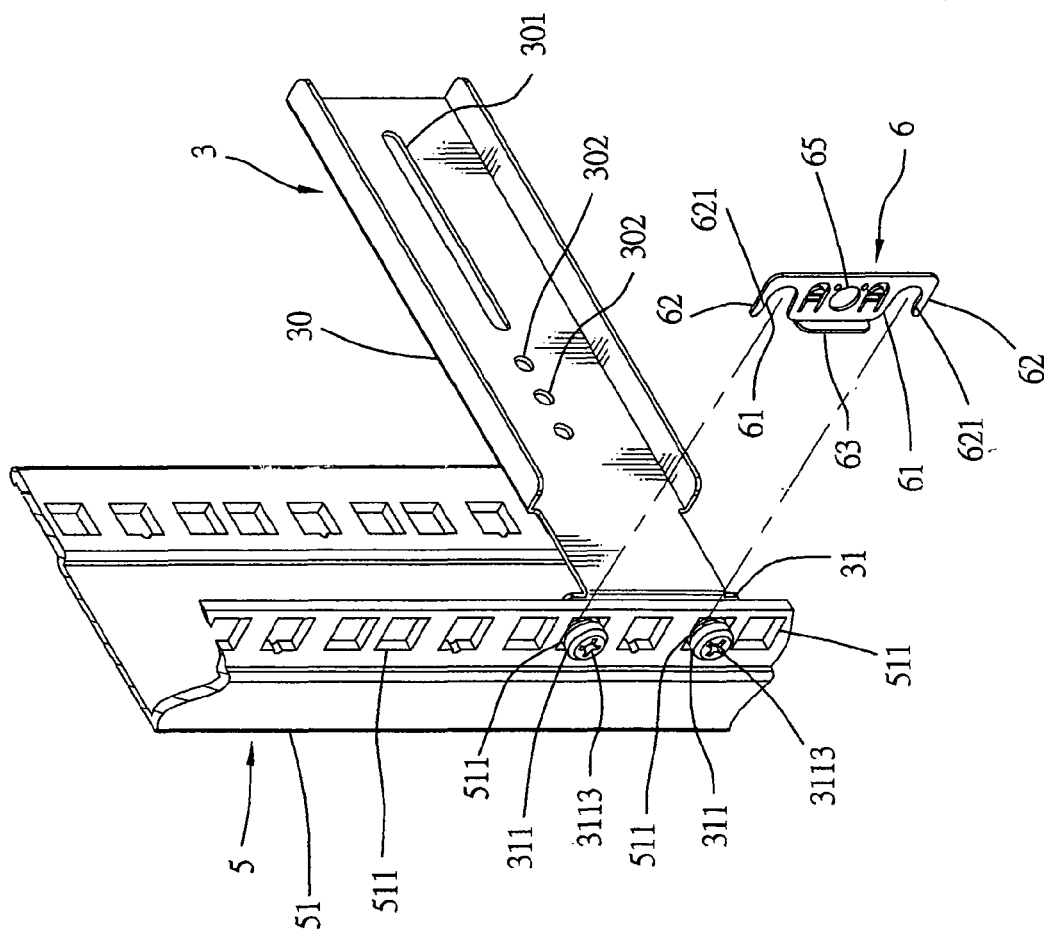
FIG. 7 illustrates the mounting members of one support frame selectively inserted into the mounting holes of the front server frame before installation of the associating clamping plate according to the present invention.
Figure 8:
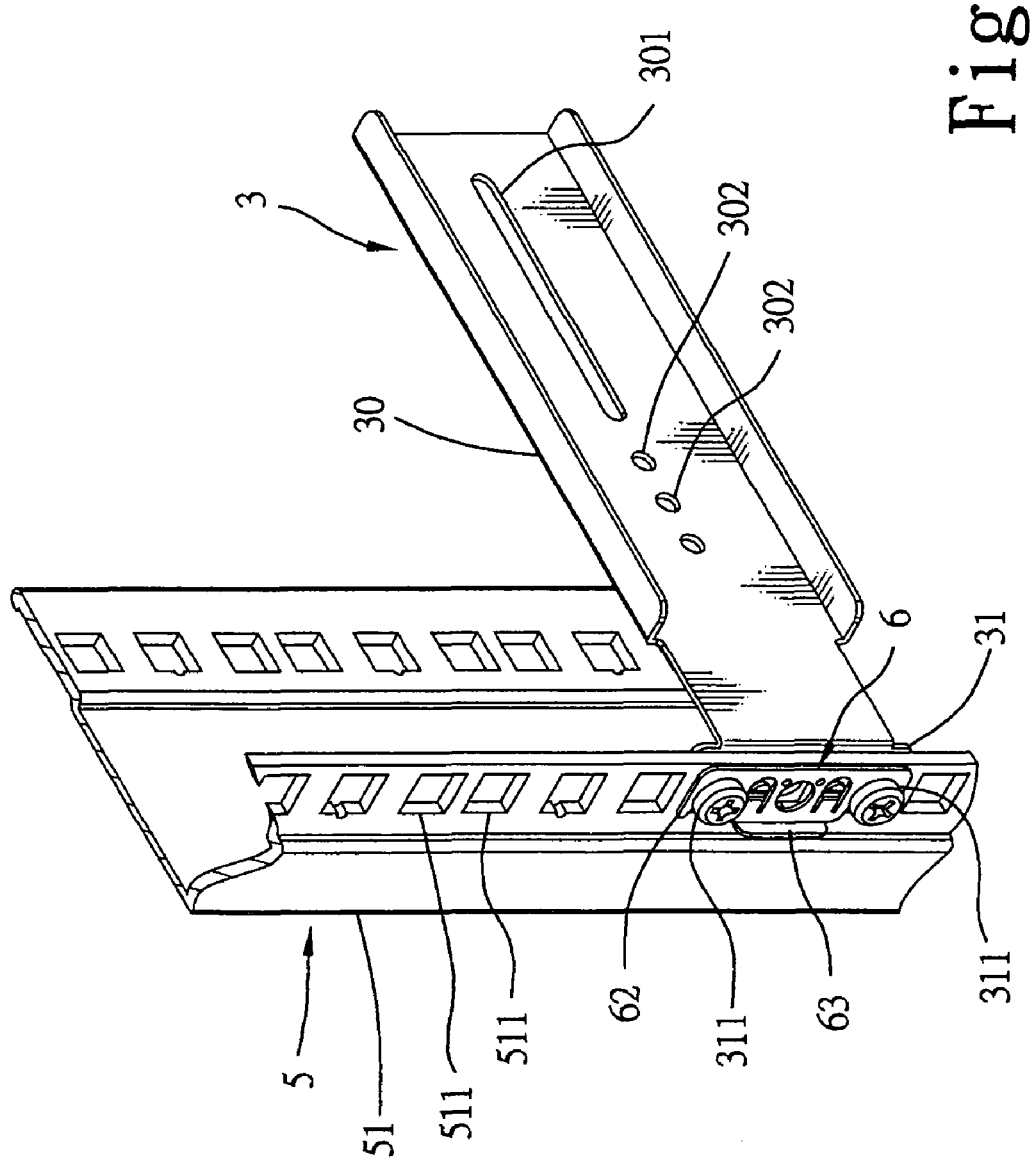
FIG. 8 corresponds to FIG. 7, showing the clamping plate installed.
Figure 9:
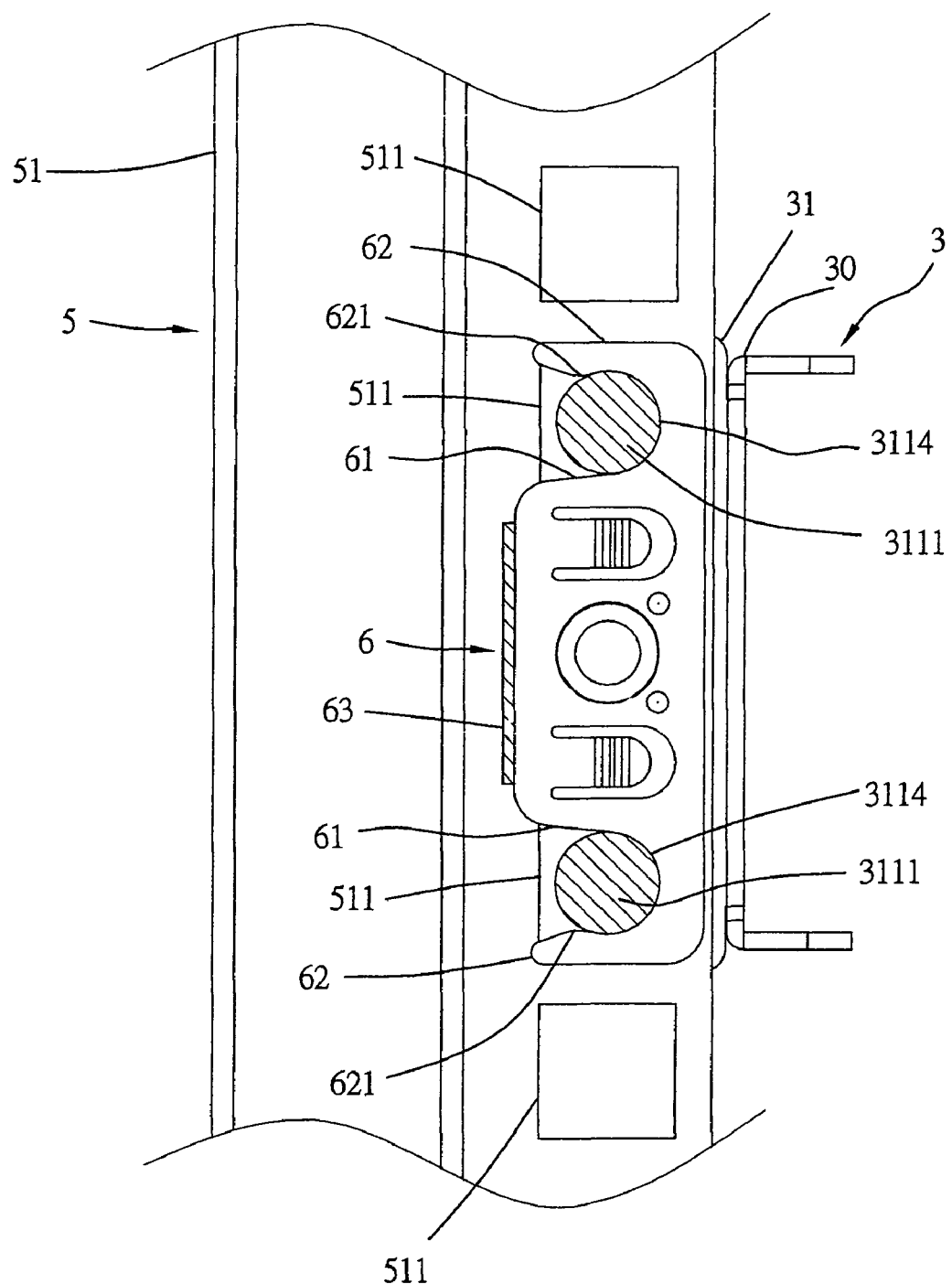
FIG. 9 is a sectional assembly view in an enlarged scale of a part of the sliding rail assembly support frame and server frame mounting arrangement according to the present invention, showing one support frame fastened to the front server frame.
Figure 10:
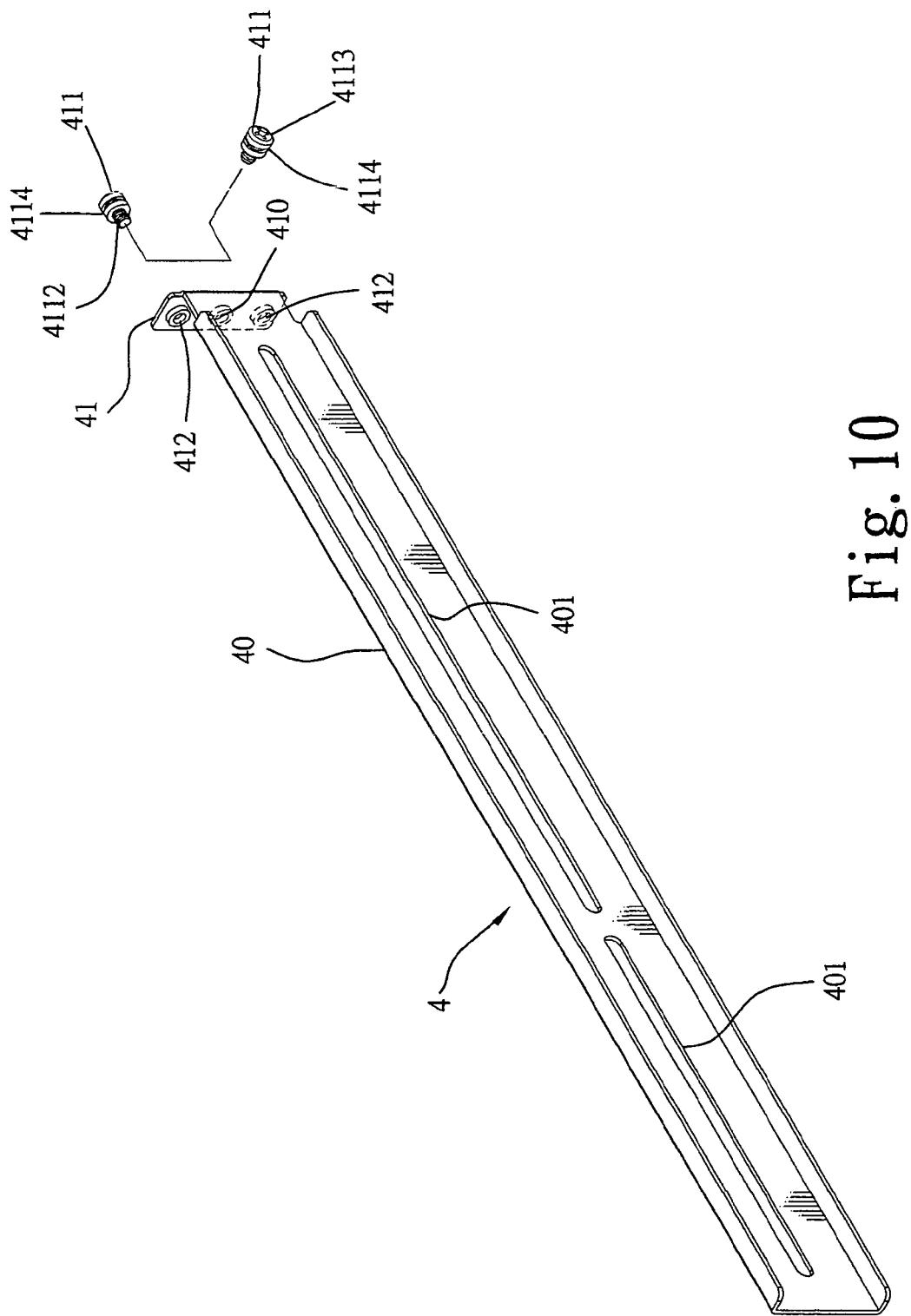
FIG. 10 is an exploded view of the other support frame for the sliding rail assembly support frame and server frame mounting arrangement according to the present invention.
Figure 11:
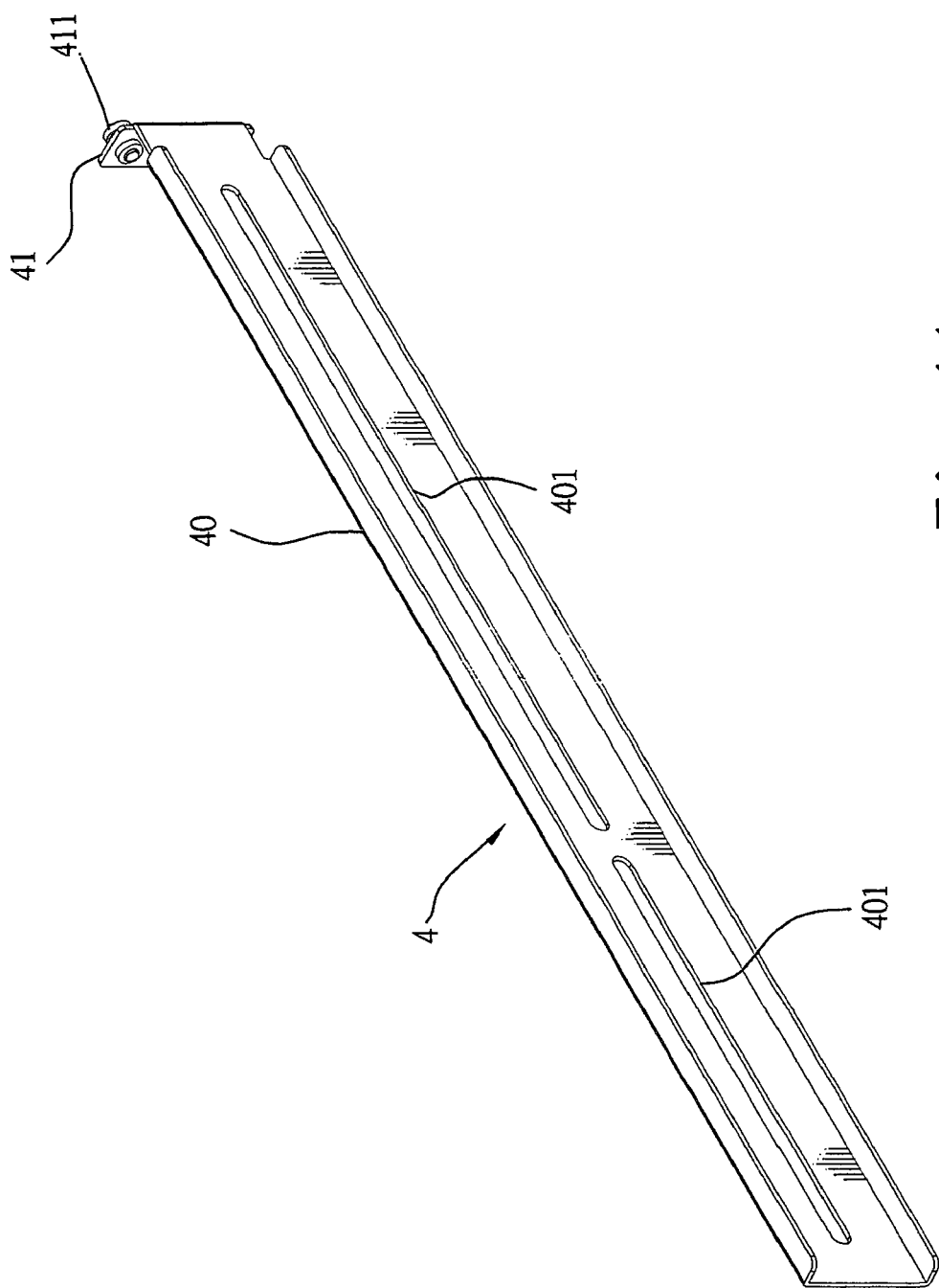
FIG. 11 is an assembly view of FIG. 10.
Figure 12:
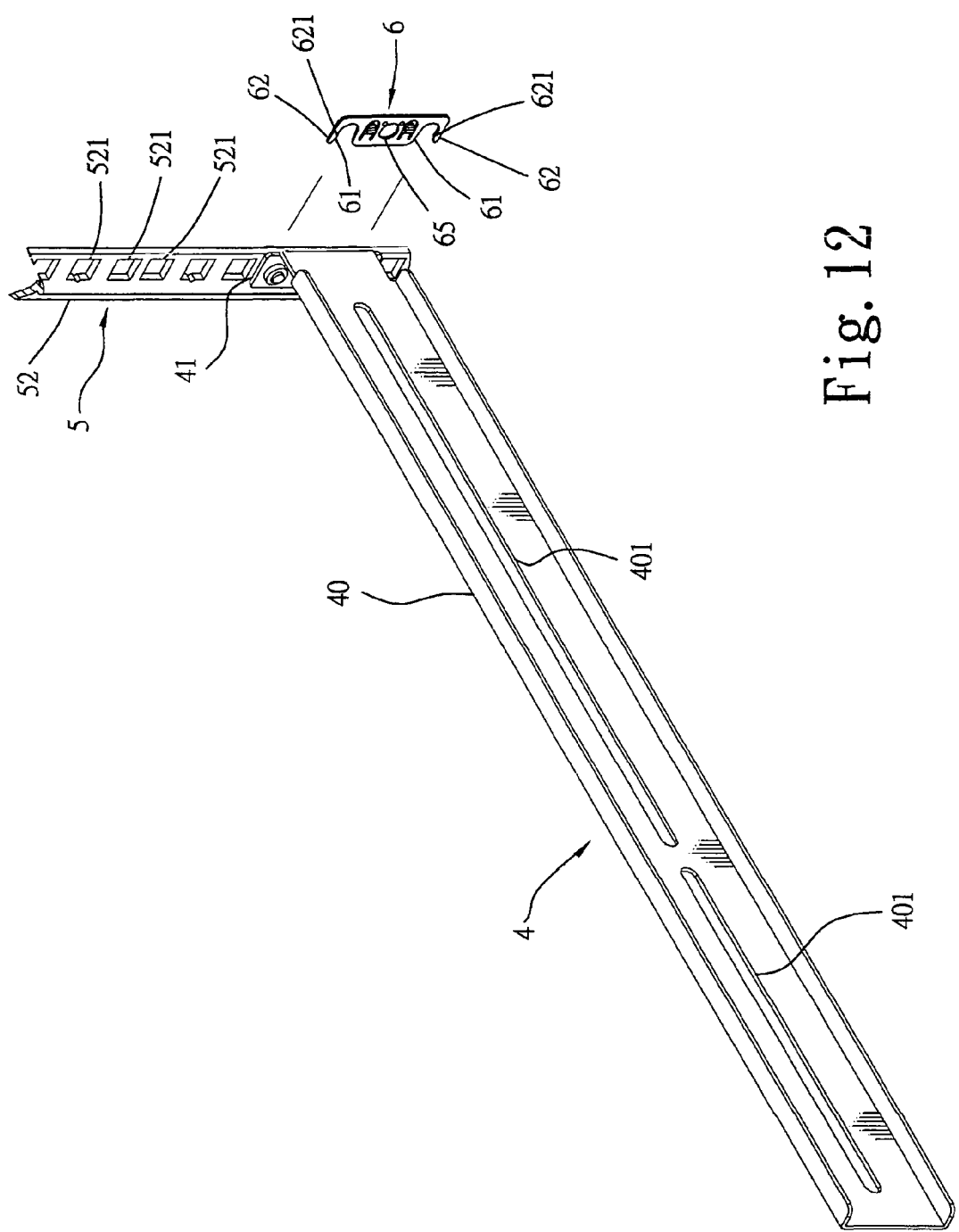
FIG. 12 illustrates the mounting members of one support frame selectively inserted into the mounting holes of the rear server frame before installation of the associating clamping plate according to the present invention.
Figure 13:
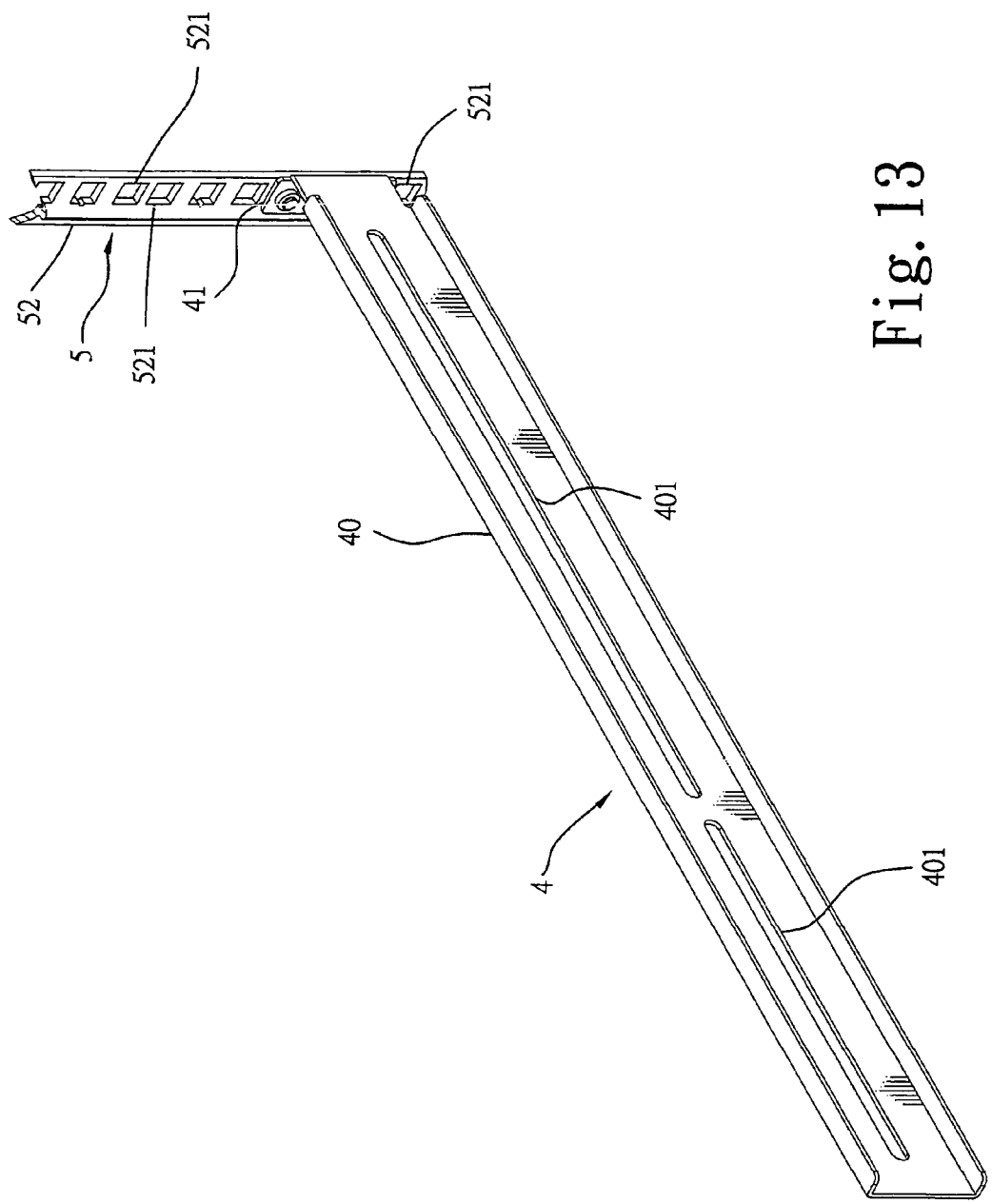
FIG. 13 corresponds to FIG. 12, showing the clamping plate installed.
Figure 14:
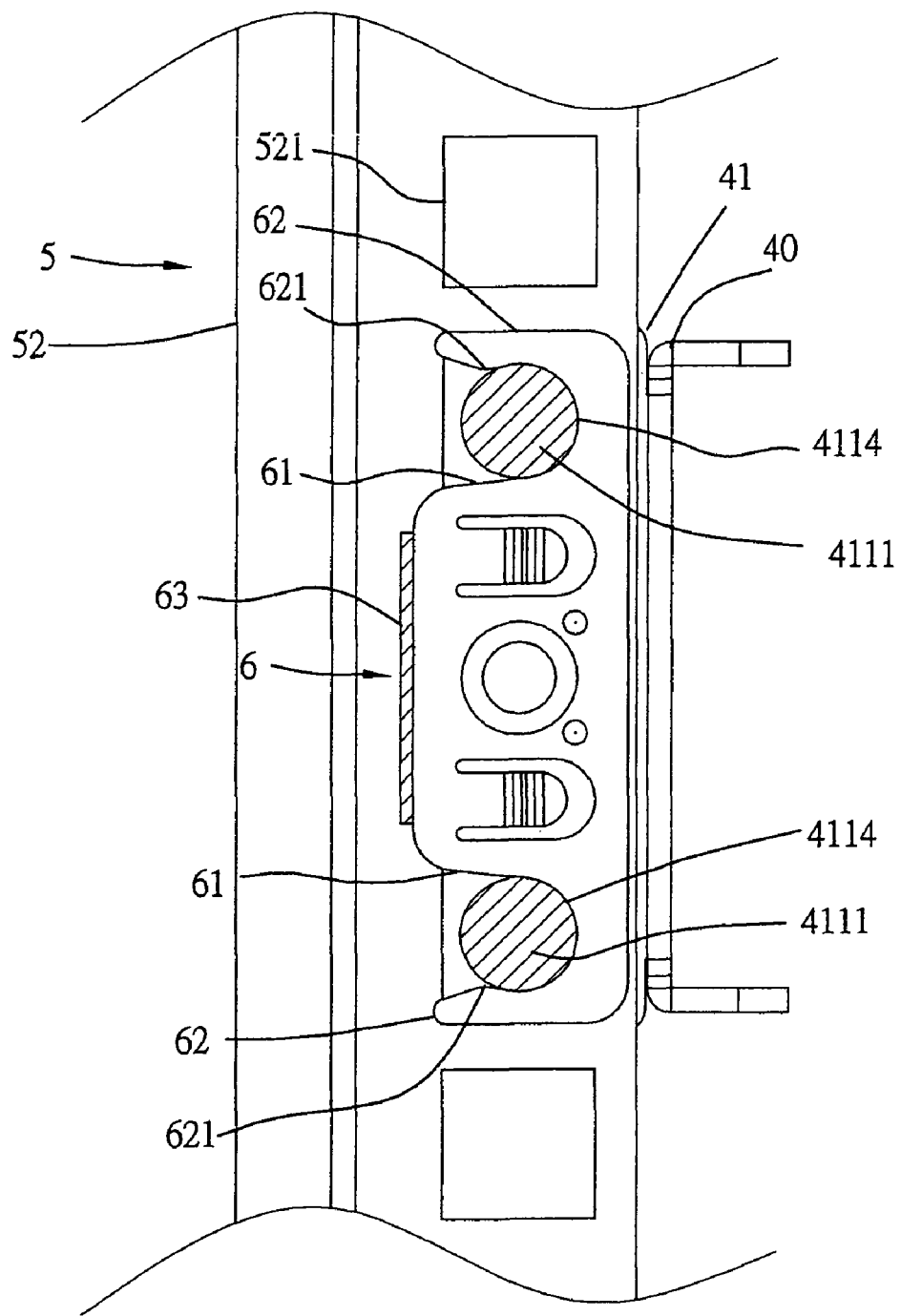
FIG. 14 is a sectional assembly view in an enlarged scale of a part of the sliding rail assembly support frame and server frame mounting arrangement according to the present invention, showing one support frame fastened to the rear server frame.

Referring to FIGS. 4-14, the front and rear ends of the outer rail 11 of a sliding rail assembly 1 are respectively affixed to support frames 3 and 4 with fastening members 2. The support frames 3 and 4 each have a flat frame base 30 or 40, and a mounting flange 31 or 41 extended from one end of the flat frame base 30 or 40 at right angles. The flat frame base 30 of one support frame 3 has one longitudinal mounting slot 301 and a plurality of mounting holes 302 in line with the longitudinal mounting slot 301. The flat frame base 40 of the other support frame 4 has two longitudinal mounting slots 401 longitudinally aligned in line. Fastening members 2 are mounted in the mounting slots 301 and 401 and the mounting holes 302 to affix the outer rail 11 to the support frames 3 and 4. The mounting flanges 31 and 41 are selectively fastened to mounting holes 511 and 521 of front and rear server frames 51 and 52. Further, the mounting flanges 31 and 41 of the support frames 3 and 4 each have a through hole 310 or 410.

The main features of the present invention are described hereinafter. The mounting flanges 31 and 41 of the support frames 3 and 4 each have mounted thereon at least two mounting members 311 or 411. The mounting members 311 and 411 each have a cylindrical body 3111 or 4111 (see FIGS. 9 and 14), and a locating groove 3114 or 4114 extending around the periphery of the cylindrical body 3111 or 4111 (see FIGS. 5 and 10). The mounting members 311 and 411 are selectively inserted through the mounting holes 511 and 521 of the front and rear server frames 51 and 52 (see FIGS. 7 and 13). Two clamping plates 6 are fastened to the cylindrical bodies 3111 and 4111 of the mounting members 311 and 411 to secure the mounting flanges 31 and 41 of the support frames 3 and 4 to the front and rear server frames 51 and 52 (see FIGS. 7, 9, 12 and 14). Each clamping plate 6 has at least two retaining notches 61 respectively forced into engagement with the locating groove 3114 or 4114 of the cylindrical bodies 3111 or 4111 of the mounting members 311 or 411 (see FIGS. 9 and 14). Each clamping plate 6 further has a protrusion 621 protruded from one sidewall 62 of each retaining notch 61 (see FIGS. 9 and 14). When the clamping plates 6 are attached to the mounting members 311 and 411, the sidewalls 62 of the respective retaining notches 61 are stretched outwards for allowing the respective protrusions 621 to move over the cylindrical bodies 3111 and 4111 of the respective mounting member 311 and 411. After the clamping plates 6 have been respectively set into position, the sidewalls 62 return to their former shape to hold the respective protrusions 621 in positive engagement with the cylindrical bodies 3111 and 4111 of the respective mounting member 311 and 411, prohibiting backward displacement of the clamping plates 6 relative to the mounting members 311 and 411.

Each clamping plate 6 further includes an angled finger strip 63 at one side for positive gripping by hand, and a through hole 65 on the middle.

Further, the mounting member 311 and 411 may be formed integral with the mounting flanges 31 and 41 of the support frames 3 and 4, or directly riveted to the mounting flanges 31 and 41 of the support frames 3 and 4, or detachably secured to the mounting flanges 31 and 41 of the support frames 3 and 4 by any of a variety of known fastening means. According to this embodiment, the mounting flanges 31 and 41 of the support frames 3 and 4 each have a plurality of screw holes 312 or 412 (see FIGS. 5 and 10). The mounting members 311 and 411 each have a threaded shank 3112 or 4112 extended from one end of the cylindrical body 3111 or 4111 and respectively threaded into the screw holes 312 or 412. The cylindrical body 3111 or 4111 of each mounting member 311 or 411 further has a tool groove 3113 or 4113 on the other end opposite to the threaded shank 3112 or 4112 through which the respective mounting member 311 or 411 is rotatable with an air or electrical power hand tool. The tool groove 3113 or 4113 can be a straight groove, crossed groove, or hexagonal socket hole.

Figure 15:
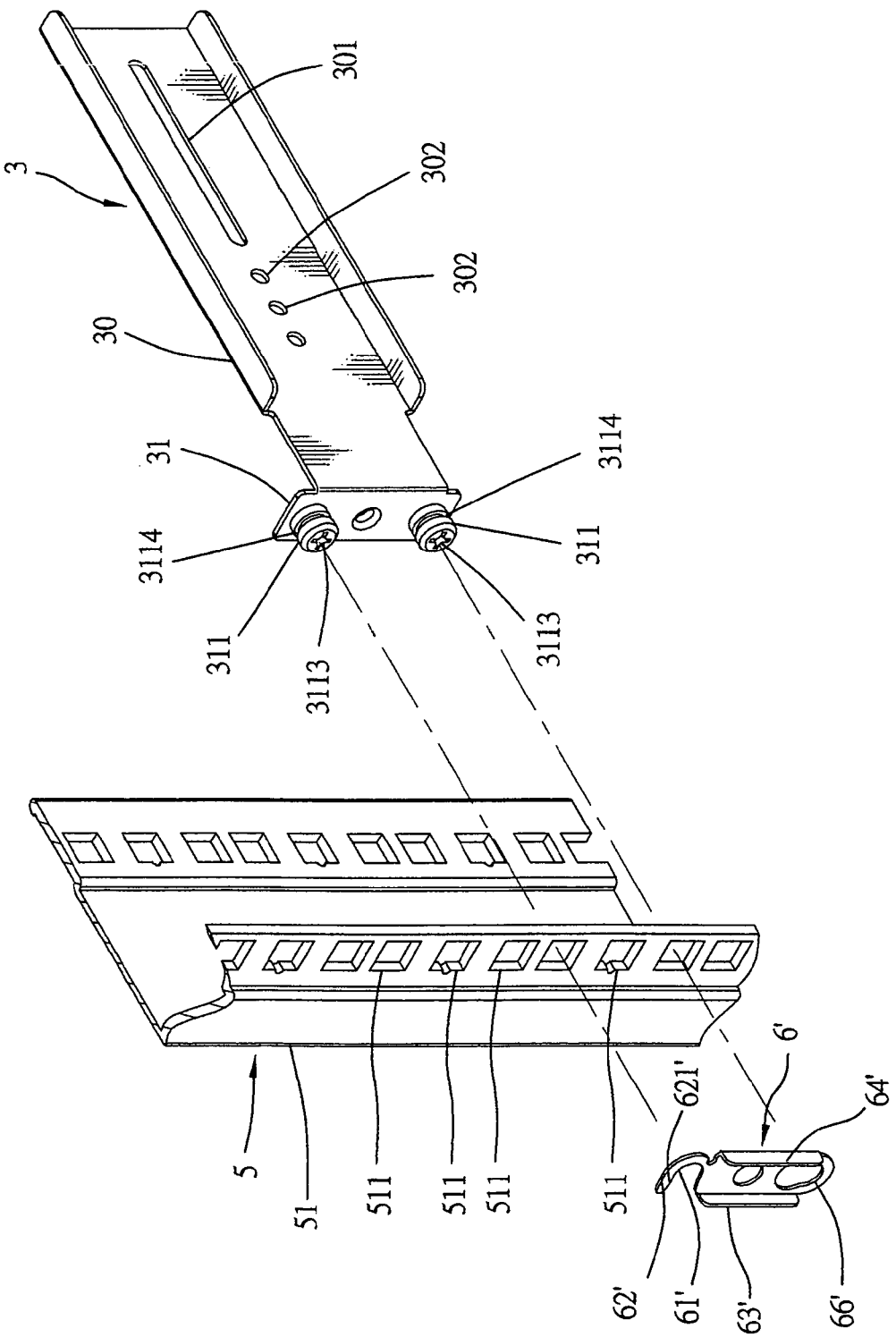
FIG. 15 is an exploded view of a part of a second embodiment of the sliding rail assembly support frame and server frame mounting arrangement according to the present invention.
Figure 16:
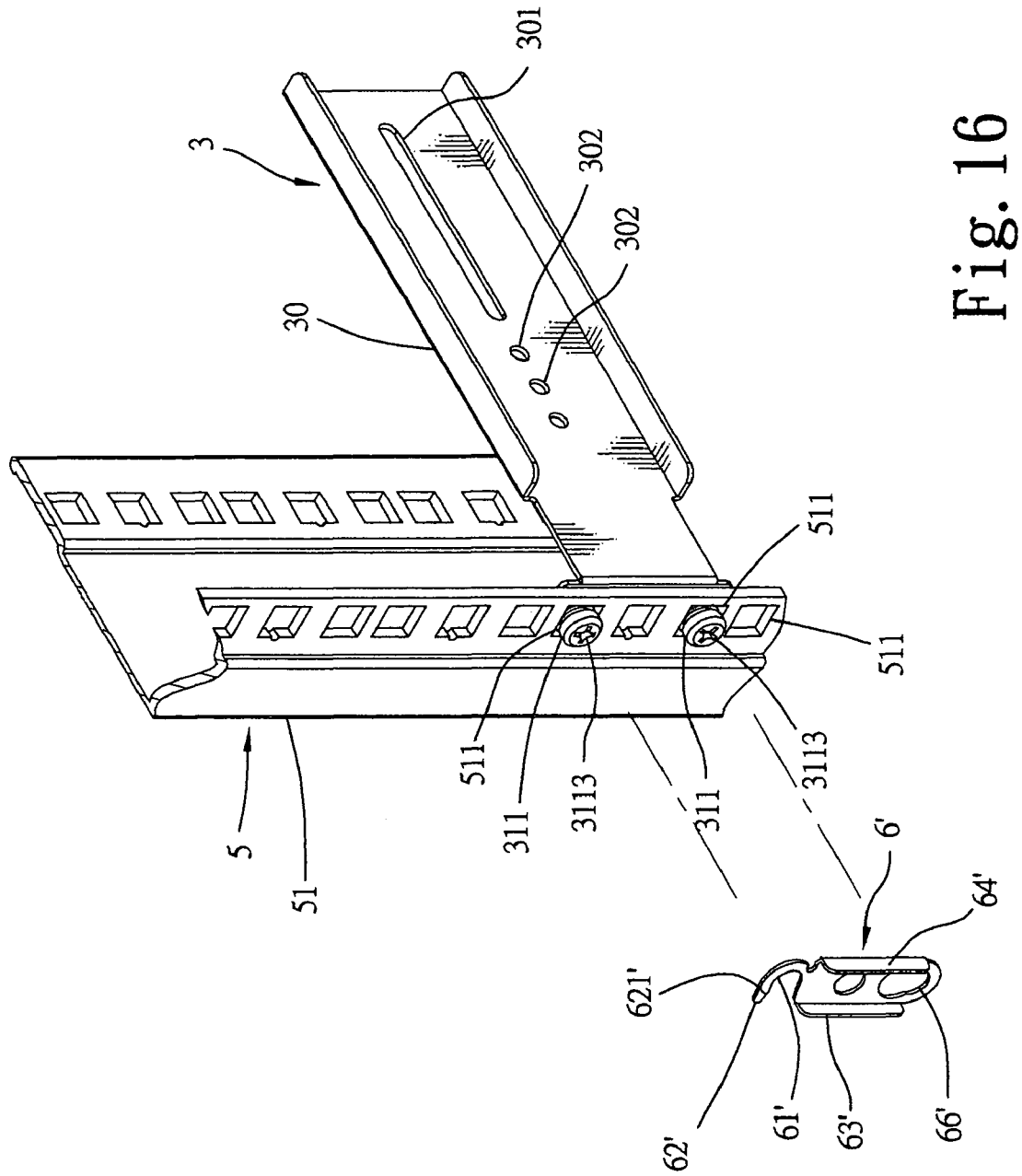
FIG. 16 corresponds to FIG. 15, showing the mounting members selectively inserted into the mounting holes of the front server frame.
Figure 17:
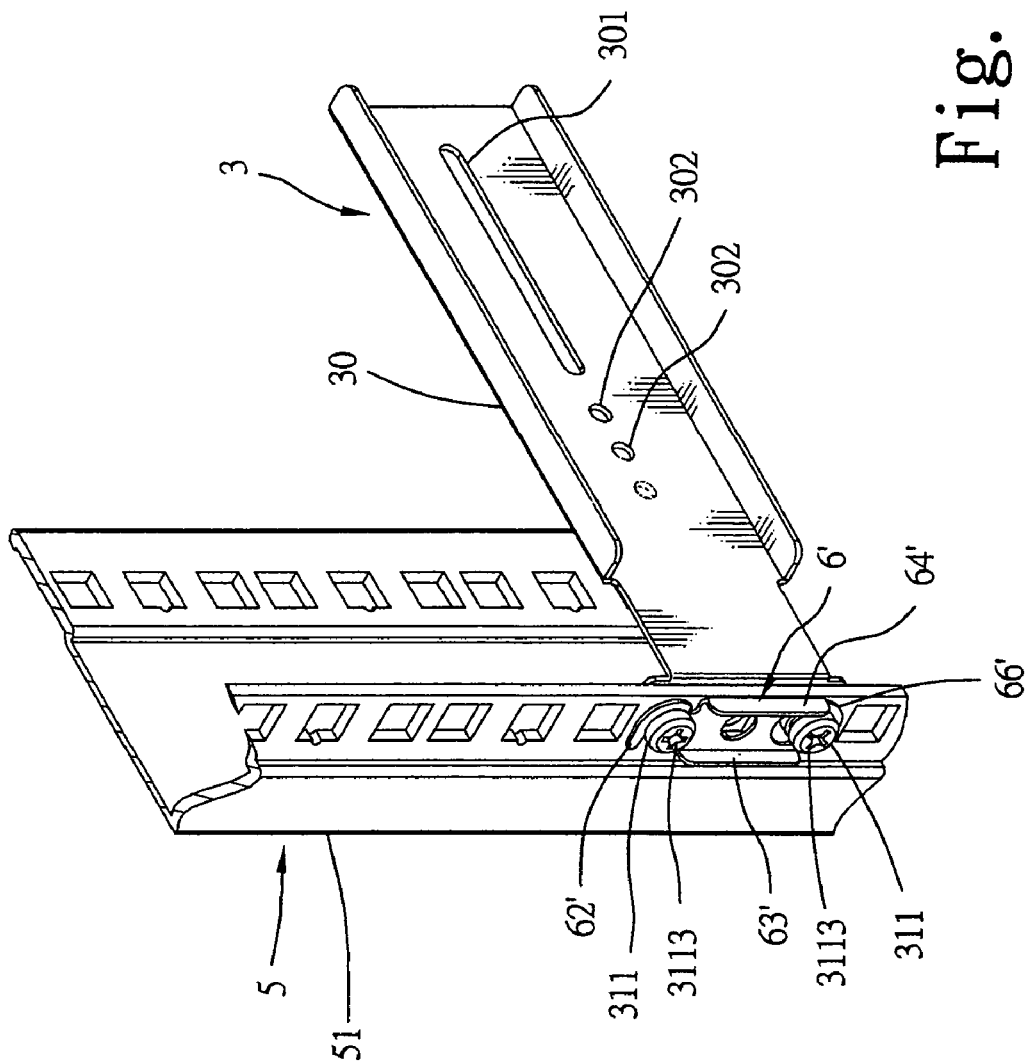
FIG. 17 corresponds to FIG. 16, showing the clamping plate fastened to the mounting members.
Figure 18:
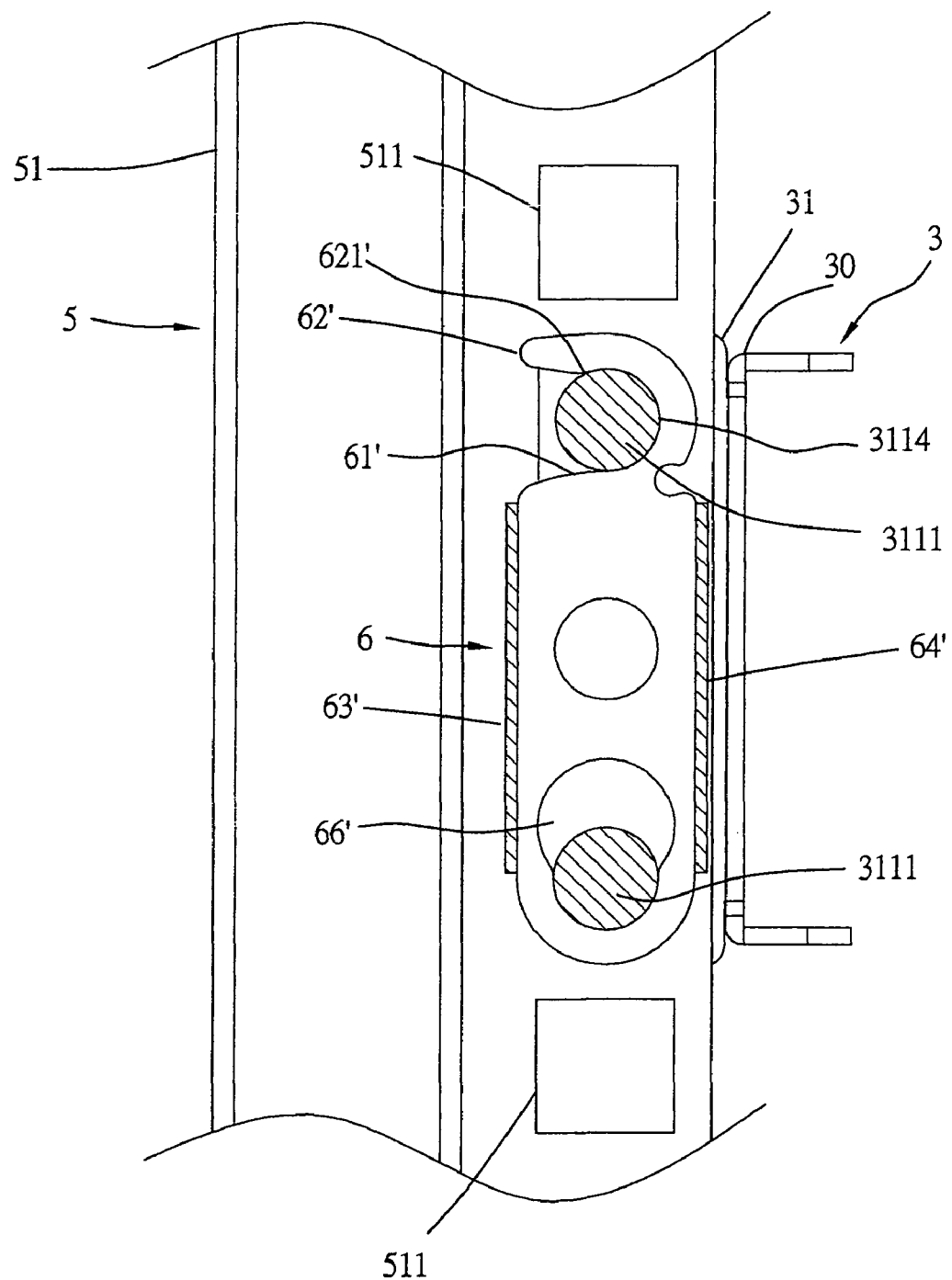
FIG. 18 is a sectional assembly view in an enlarged scale of a part of the second embodiment of the sliding rail assembly support frame and server frame mounting arrangement according to the present invention, showing the respective support frame fastened to the front server frame.

FIGS. 15~18 show an alternate form of the present invention. This second embodiment is substantially similar to the aforesaid first embodiment. According to this second embodiment, each clamping plate 6' has a retaining notch 61' at one end, a keyway 66' at the other end (see FIG. 18), a protrusion 621' protruded from one sidewall 62' of the retaining notch 61' (see FIG. 18), and two angled finger strips 63', 64' at two opposite sides (see FIGS. 15 and 16). The keyway 66' is formed of a big hole and a small hole in communication with the big hole at one side. The small hole of the keyway 66' has a diameter approximately equal to the diameter of the locating groove of the cylindrical body of each mounting member 3. The big hole of the keyway 66' has a diameter greater than the small hole. When the mounting members 311 are inserted through respective mounting holes 511 of the front server frames 51 (see FIG. 16), the clamping plate 6' is hung on one mounting member 311 at the mounting flange 31 of the support frames 3 by means of the big hole of the keyway 66', and then clamping plate 6' is pulled in one direction to move the small hole of the keyway 66' into coupling with the cylindrical body 3111 of the associating mounting member 311, and then the clamping plate 6' is turned about the associating mounting member 311 to force the retaining notch 61' into engagement with the locating groove 3114 of the cylindrical body 3111 of the other mounting member 311 at the mounting flange 31 of the support frames 3 (see FIG. 17). At this time, the protrusion 621' is forced into engagement with the cylindrical body 3111 of the associating mounting member 311 to prohibit displacement of the clamping plate 6' relative to the mounting flange 31 of the support frames 3.

As indicated above, the invention has the following advantages:

1. The mounting members 311 and 411 at the mounting flanges 31 and 41 of the support frames 3 and 4 being respectively fastened to the front and rear ends of the outer rail 11 of the sliding rail assembly 1 can be selectively inserted through the mounting holes 511 and 521 of the front and rear server frames 51 and 52 of the server frame unit 5 and then secured thereto with the clamping plates 6. This mounting procedure saves much labor and time.

2. The clamping plates 6 each have an angled finger strip 63 for positive gripping with the hand. Therefore, the clamping plates 6 can easily be installed without tools.

What is claimed is:

1. A sliding rail assembly support frame and server frame mounting arrangement comprising:

two server frames, said server frames each having a plurality of mounting holes arranged at different elevations;

two support frames respectively fastened to said server frames to support a sliding rail assembly, said support frames each having a flat frame base respectively affixed to front and rear ends of an outer rail of said sliding rail assembly and a mounting flange perpendicularly extended from one end of said flat frame base and selectively fastened to the mounting holes of said server frames;

wherein the mounting flange of each of said support frames has a plurality of vertically spaced mounting members selectively insertable into the mounting holes of one of said server frames and secured thereto with a clamping plate, said mounting members each having a cylindrical body insertable through one mounting hole of one of said server frame and a locating groove extending around the periphery of said cylindrical body, said clamping plate having a keyway and at least one retaining notch arranged at different elevations and aligned in line for engagement with the locating grooves of the cylindrical bodies of said mounting members, said keyway having a closed perimeter and comprising a big hole and a small hole in communication with said big hole at one side, said small hole having a diameter approximately equal to the diameter of the locating groove around the periphery of the cylindrical body of each of said mounting members, said big hole having a diameter greater than said small hole; and wherein said at least one retaining notch of said clamping plate has a sidewall and a protrusion protruded from said sidewall for engaging the cylindrical body of one of said mounting members to prohibit displacement of said clamping plate relative to said mounting members after engagement of the small hole of said keyway with the locating groove of the cylindrical body of one of said mounting members and engagement of the at least one retaining notch with the locating groove of the cylindrical body of another of said mounting members.

2. The sliding rail assembly support frame and server frame mounting arrangement as claimed in claim 1, wherein said clamping plate has an angled finger strip at one side.

3. The sliding rail assembly support frame and server frame mounting arrangement as claimed in claim 1, wherein the mounting flange of each of said support frames has a plurality of screw holes for the mounting of the mounting members of the respective support frame; said mounting members each having a threaded shank extended from one end of the cylindrical body thereof for threading into one screw hole of the mounting flange of one of said support frames.

4. The sliding rail assembly support frame and server frame mounting arrangement as claimed in claim 3, wherein the cylindrical body of each of said mounting members has a tool groove on an end thereof opposite to the respective threaded shank.

5. A sliding rail assembly support frame system for mounting a sliding rail assembly to server frames that have a plurality of mounting holes arranged at different elevations, said sliding rail assembly support frame system comprising:

first and second support frames with each support frame having a flat frame base configured to be connected to a respective front or rear end of an outer rail of a sliding rail assembly, wherein each support frame further comprises a mounting flange that extends perpendicularly from one end of said flat frame base;

each mounting flange having a plurality of vertically spaced mounting members that extend perpendicularly from the mounting flange and each mounting member having a cylindrical body insertable through one mounting hole of a server frame;

each cylindrical body of one of the mounting members having a locating groove extending around the periphery of the cylindrical body;

first and second clamping plates with each clamping plate having a keyway and at least one retaining notch arranged at different elevations and aligned in line for engagement with the locating grooves of the respective cylindrical bodies of the mounting members that extend from a respective one of the mounting flanges;

the keyway of each clamping plate having a closed perimeter and comprising a big hole and a small hole in communication with said big hole, said small hole having a diameter approximately equal to the diameter of the locating groove around the periphery of the cylindrical body of each of the mounting members, and said big hole having a diameter greater than said small hole; and the at least one retaining notch of each clamping plate having a sidewall and a protrusion protruding from the sidewall with the protrusion configured to engage the cylindrical body of one of the mounting members to prohibit displacement of the clamping plate relative to the mounting members after engagement of the small hole of the keyway with the locating groove of the cylindrical body of one of the mounting members and engagement of the at least one retaining notch with the locating groove of the cylindrical body of another of the mounting members.

6. The sliding rail assembly support frame system for mounting a sliding rail assembly to server frames as claimed in claim 5, wherein each clamping plate has a finger strip that extends from one side of the respective clamping plate.

7. The sliding rail assembly support frame system for mounting a sliding rail assembly to server frames as claimed in claim 5, wherein the mounting flange of each of the support frames has a plurality of screw holes configured to receive mounting members, and each mounting member has at one end a threaded shank for threading into one of the screw holes.

8. The sliding rail assembly support frame system for mounting a sliding rail assembly to server frames as claimed in claim 7, wherein each of the mounting members has a tool groove on an end thereof opposite to the end having the respective threaded shank.

* * * * *